United States Patent [19]
Campbell et al.

[11] Patent Number: 5,091,049
[45] Date of Patent: Feb. 25, 1992

[54] HIGH DENSITY PLASMA DEPOSITION AND ETCHING APPARATUS

[75] Inventors: Gregor Campbell, Glendale; Robert W. Conn, Los Angeles, both of Calif.; Tatsuo Shoji, Nagoya, Japan

[73] Assignee: Plasma & Materials Technologies, Inc., Burbank, Calif.

[21] Appl. No.: 545,636

[22] Filed: Jun. 29, 1990

Related U.S. Application Data

[62] Division of Ser. No. 365,533, Jun. 13, 1989, Pat. No. 4,990,229.

[51] Int. Cl.⁵ .................. B44C 1/22; B05D 3/06; C23C 14/00
[52] U.S. Cl. .................. 156/643; 156/646; 156/345; 118/728; 118/50.1; 118/620; 118/623; 427/38
[58] Field of Search .................. 156/643, 646, 345; 427/38, 39; 204/298.06, 298.16, 298.37, 298.38; 315/111.21, 111.31, 111.41, 111.81; 118/723, 728, 50.1, 620, 623

[56] References Cited

U.S. PATENT DOCUMENTS

| | | | |
|---|---|---|---|
| 4,339,326 | 7/1982 | Hirose et al. | 204/298.38 |
| 4,776,918 | 10/1988 | Otsubo et al. | 156/345 |
| 4,810,935 | 3/1989 | Boswell | 315/111.41 |
| 4,828,649 | 5/1989 | Davis et al. | 156/643 |
| 4,876,983 | 10/1989 | Fukuda et al. | 118/722 |

*Primary Examiner*—William A. Powell
*Attorney, Agent, or Firm*—Merchant, Gould, Smith, Edell, Welter & Schmidt

[57] ABSTRACT

The high density RF plasma generator of this invention uses special antenna configurations (15) to launch RF waves at low frequency such as 13.56 MHz along a magnetic field supplied by an external magnetic field generator (16.17) in a discharge space (14) where the working gas is introduced and which is used alone or in conjunction with a process chamber (18) where specimen substrates (20) are located to either deposit or etch films from a substrate or to sputter deposit films to a substrate. The plasma etching, deposition and/or sputtering system comprises the high density RF plasma generator, the external magnetic field, the gas injection and control system, the antenna system (15) and associated power supplies (48), the process chamber (18), and the means to couple plasma from the generator to substrates or targets, including magnetic means (36) to enhance plasma uniformity at the substrates (20) or targets (92).

16 Claims, 14 Drawing Sheets

HIGH DENSITY PLASMA DEPOSITION AND ETCHING APPARATUS

This is a divisional of application Ser. No. 07/365,533, filed June 13, 1989, now U.S. Pat. No. 4,990,229.

BACKGROUND OF THE INVENTION

Field of the Invention

The present invention relates to a plasma deposition or etching method and various apparatus for depositing a thin film onto a substrate or removal (etching) of a film from a substrate.

DESCRIPTION OF RELATED TECHNOLOGY

Etching

Plasma etching involves using chemically active atoms or energetic ions to remove material from a substrate. It is a key technology in the fabrication of semiconductor integrated circuits. However, before the advent of microwave plasmas utilizing the electron cyclotron resonance (ECR) it was becoming difficult for conventional plasma etching techniques to satisfy the requirements dictated by the increase in device packing density. Specifically, the requirement for fine pattern etching (anisotropic etching) and the requirements for low damage and high selectivity could hardly be satisfied at the same time.

Deposition

Plasma Enhanced Chemical Vapor Deposition is a widely used technique to deposit materials on substrates in a host of applications. In normal CVD the chemical reaction is driven by the temperature of the substrate and for most reactions is high ($>800°$ C.). The high substrate temperature needed precludes this method from use in a number of applications particularly in microelectronics, displays and optical coatings. The role of the plasma is to dissociate and activate the chemical gas so that the substrate temperature can be reduced. The rate of dissociation, activation and ionization is proportional to the density of the plasma. It is therefore of importance to make the plasma as dense as possible.

Sputtering

Sputtering is also a widely used method for depositing materials onto substrates for a wide variety of applications such as the production of hard or decorative coatings and the coating of glass. In general, a plasma is produced at the sputter target material and the sputter target is biased to a negative voltage of around 700 V. Plasma ions, generally argon, impact the surface and sputter the material which then transports as neutral atoms to a substrate. Reactive gases can be introduced to chemically react with the sputtered atoms at the host substrate in a process called reactive sputter deposition. Rate is often important and it is therefore important to make the plasma as dense as possible. Ionization of reactive gases is also important and is helped by having plasma in the vicinity of the substrate material. Sputtering is also done by ions accelerated in an ion or plasma gun and then made to bombard the sputter target. In this case, a bias voltage on the target is not necessary. For sputtering insulating materials, RF voltage bias can be applied to the sputter target.

Existing Methods

There are presently two widely used methods for plasma deposition and etching, the parallel plate reactor and the ECR plasma deposition system.

Parallel Plate Reactor (Diode)

The RF diode has been widely used for both deposition and etching. It is described in detail in the book by Chapman ("Glow Discharge Processes" John Wiley & Sons 1980). It uses RF at 13.56 MHz capacitively coupled to one electrode while the other electrode is grounded. The pressure in the system is typically 1 mtorr - 1 torr and the plasma density is typically $10^{10}$ electrons per cc. The rate at which both deposition or etching occurs is dependent on the density of the plasma and the density (pressure) of the reactive gas used to etch or in CVD processes to deposit.

In etching, the high pressure needed to sustain the discharge causes collisions between the ions and the background gas. This causes the paths of the etching ions or atoms to be ramdomised or non-directional leading to undercutting of the mask. This is referred to as an isotropic etch. It is desirable to have the etch atoms or ions be directional so that straight anisotropic etches can be achieved. At the high pressure used in RF diode discharges it is necessary for the ions to have high energy (1 keV) to achieve an anisotropic etch. However the high energy of the ions can cause damage to the substrate, film materials or photoresist.

The plasma is sustained by secondary electrons that are emitted by ions impacting the cathode. These electrons are accelerated by the voltage drop across the sheath which is typically 400–1000 V. These fast electrons can bombard the substrate causing it to have a high voltage sheath drop. This high voltage can accelerate the ions leading to damage of the substrate or film material. The presence of high energy electrons leading to high voltage sheath drops is undesirable.

Electron Cyclotron Resonance Plasmas

The advent of using microwaves at 2.45 GHz and a magnetic field of 875 Gauss to utilize electron cyclotron resonance allowed the generation of high density plasmas at low pressure. The advantages of this technique for plasma etching are described by Suzuki in an article entitled "Microwave Plasma Etching" published in Vacuum 34 No. 10/11 1984. Due to a low gas pressure (0.04–0.4 Pa) and high plasma density ($1.7-7 \times 10^{11}$ electrons/cm$^3$) anisotropic etch with high etch rates is achievable.

Suzuki, in U.S. Pat. No. 4,101,411, describes a plasma etching apparatus using ECR; Matsuo, in U.S. Pat. No. 4,401,054 describes a plasma deposition apparatus utilizing ECR.

While this technique is desirable over the parallel plate reactor in many respects it has several limitations. The magnetic field needed is very high (1-2 kG) which means that heavy, power consuming electromagnets must be used. The maximum density is limited by either cut-off in certain configurations or by refraction in other configurations to the value of $1 \times 10^{12}$ electrons/cm$^3$. The expense of the power supply and necessary hardware to generate and transmit the microwaves is high. The uniformity (or width of the plasma profile) is not very good.

In the present invention the objective is to use low frequency whistler waves to generate plasmas of greater density than is possible with the methods described above. Below the physics of whistler wave propagation in plasmas is discussed.

Whistler Waves

In a cylindrical geometry these waves are generally referred to as helicon waves. The classical helicon wave was first investigated by Lehame and Thonemann and is governed by the following equations:

$$\nabla \times E = \delta B/\delta t, \nabla \times B = \mu_0 j, \nabla \cdot B = 0$$
$$E = j \times B_o/en_o, E_z = \eta j_z$$

where E is the Electric Field, B is the magnetic field, j is the current density, Bo is the vacuum magnetic filed, $\mu$ is the permitivity, e is the charge on an electron, n is the density of the plasma and $\eta$ is the resistivity of the plasma.

Following the derivation of Chen one can easily find perturbations of the form B exp(i(m+kz−wt)), and in the $\eta = 0$ limit the above equations follow:

$$\nabla^2 B + \alpha^2 B = 0$$

where $\alpha = (w/k) (\mu.en./B.)$
where $j = (\alpha/\mu.) B$ and w is the angular frequency of the wave, k is the wave number, $2\pi/\lambda$, where $\lambda$ is the wavelength. These equations can be solved in cylindrical coordinates to yield the dispersion relation:

$$m \alpha J_m(T a) + Tka J_m^1(T a) = 0$$

where, $J_m$ is a Bessel function of the first kind, $J_m$ is a derivative of $J_m$ with respect to its argument and T is a transverse wave number defined by $$T^2 = \alpha^2 - k^2$$

It is important to remember that m is the mode number that describes the $\theta$ dependence of perturbations of the form B exp(i)m$\theta$+kz−wt)
The two lowest modes satisfy $$J_1(T a) = 0 \quad (m=0)$$

$$J_1(T a) = T k a/2\alpha(J_2 - J 0) \quad (m-1)$$

This leads to the simple relation $$[w/wc) (w_p^2/c^2k_z^2)]^2 = 1 + (3.83/k_z a)^2$$

where
$w_c$ = cyclotron angular frequency
$w_p$ = plasma frequency
for the m=0 mode.

The above derivation is important to understand how to design the antenna in order to excite the desired mode.

Another important mechanism to understand is the damping of the wave by the plasma. In the papers by Boswell wave damping by electron collisions could not explain the experimentally observed results. Chen, however, determined that Landau damping was responsible for the large damping observed experimentally. Landau damping is a collisionless damping of waves in a plasma due to particles in the plasma that have a velocity nearly equal to the phase velocity of the wave. These particles travel with the wave, do not see a rapidly fluctuating electric field and so can effectively exchange energy with the wave. In a plasma there are electrons both faster and slower than the wave. In a Maxwellian distribution, however, there are more slow electrons that fast ones and so there are more particles taking energy from the wave than vice versa.

The damping rate due to Landau damping has been calculated by Chen for helicon waves and can be expressed as:

$$\text{Damping Rate} = Jm(K_z)/Re(K_z) \, 2\sqrt{\pi} \, c^2(3.8/a)^2 \, \zeta^3 \, e^{-\zeta^2}$$

where $\zeta = w/k_z V_{th}$
and $V_{th}$ is the thermal velocity of the plasma electrons. It is of interest to demonstrate how sensitive the damping rate is to the value of k because it is such a steep function of $\zeta$. Take for example a plasma with a density of $10^{12}$ electrons/cm$^3$, an electron temperature of 3 cV and a driving frequency of 8 MHz. The collisional damping rate would be 0.065 and the Landau damping rate would be 0.6 for $k_z = 0.25$ cm$^{-1}$ and 0.0005 for $k_z = 0.125$ cm$^{-1}$. It is clear that Landau damping is the important damping mechanism and that it is very dependent on the wave number $k_z$.

Antenna Excitation of Whistler Waves

There are a number of factors important in choosing the right antenna structure to excite whistler waves for generation of plasmas:
a) Frequency of excitation
b) Wave mode
c) Efficiency of coupling RF power to plasma a) Frequency of Excitation

The frequency of the waves should be such that it satisfies $\Omega_c < w < w_c$ where $\Omega_c$ is the ion cyclotron frequency e $B_o/M_i$ and $w_c$ is the electron cyclotron frequency e $B_o/M$. These waves are low frequency waves that operate far below the electron cyclotron frequency. Another important consideration for commercial application is to use an industrial standard frequency such as 13.56 MHz. The bounds are then determined by the magnetic field strength and the type of gas used.

b) Wave Mode

It is important to understand the mode structure of the wave electric and magnetic fields so that an antenna arrangement can best be designed to efficiently couple the RF power into wave excitation. As discussed above the two lowest modes are the m=0 and m=1 modes. In FIG. 1 the mode structure of the wave electric field for an m=0 mode is shown. The figure shows the electric field vector 128 on a circular plane 129 at different positions along the direction of wave travel, z. It can be seen that, within a wavelength, the electric field can be purely radial 128 or purely azimuthal 130 with the electric field on one plane 131 being anti-clockwise while on a plane 132 one half-wavelength away it is clockwise. From this physical picture the best way to excite this mode would be with two loops separated in distance by a half-wavelength, $\pi/k_z$, where $k_z$ is given from the previously stated dispersion relation. In FIG. 2 the mode structure of the wave electric field for an m=1 mode is shown. It can be seen that there is a natural helical pitch to the electric and magnetic field vectors as the wave propagates along the z direction and that the electric field vector 133 is rotating in a right handed sense, i.e., it rotates clockwise as it travels along $B_o$ which is in the z direction. From this picture the best way to excite this mode would be with a helical shaped antenna with the pitch of the helix given by $2\pi/k_z$ where $k_z$ is given from the above dispersion relations.

c) Efficiency of Coupling RF Power to Plasma

The efficiency of plasma production depends on the coupling of RF energy into the plasma. As discussed above the important mechanism for damping of the RF energy is Landau damping. The phase velocity of the whistler wave is given by $w/k_z$, where $k_z$ is given by the dispersion relation and depends on the plasma density and vacuum magnetic field strength. Ideally the phase velocity of the wave should be near the maximum of the ionization potential of the gas we wish to ionize. From the above dispersion relation for the m=0 mode:

$$n = \alpha B_o k_z (T^2 + k_z^2)^{\frac{1}{2}}$$

where $\alpha = B_0 k_z^2$ for $T < k_z$.

In other words, the higher the value of $k_z$, the higher the density. However, the phase velocity of the wave is $w/k_z$ and so increasing $k_z$ decreases the energy of the electrons that are accelerated by the wave. If the $k_z$ is too high then the energy of the electrons may fall below the ionization potential. It is therefore important to control $k_z$ in order to be able to increase the density and control the electron temperature.

The first use of whistler waves to generate dense plasmas was described by Boswell. In this publication the type of antenna used for excitation was as shown in FIG. 3a. This antenna configuration had been used by Ovchinnikov and has been previously described. This type of antenna excites the m=1 mode due to the current flowing in the conductors 134 running parallel to the direction of the magnetic field $B_o$. The frequency of excitation was 8 MHz. The density profile of the 10 cm plasma was found to be quite peaked, particularly at the higher magnetic field strengths needed for high densities.

In these publications the mechanism for efficient coupling of the RF energy to the plasma could not be explained. Chen, in an Australian National University report, explained the mechanism as Landau damping.

Chen, in a paper presented in August 1988, described a system using whistler waves to generate dense plasmas for use in advanced accelerators. The type of antenna used in this arrangement was similar to that used by Boswell in that it excited the m=1 mode and was of a type known as the Nagoya Type III antenna. This type of antenna is explained in a paper by Watari (78) and is illustrated in FIG. 3b. The frequency of excitation was 30 MHz.

SUMMARY OF THE INVENTION

The present invention utilizes whistler waves to generate plasmas of high density for use in plasma etching, deposition, and sputtering equipment. The efficient generation of plasma depends strongly on the antenna configuration used. The invention includes two new antenna configurations designed to excite the m=0 and m=1 modes and to control the wave number of the excited wave. This has been shown to be important in maximizing the density for a given input power and to give control over the electron temperature or average energy of the electrons in the plasma. We have also found that the m=0 antenna gives a more uniform plasma than previous designs and that the helical pitch of the m=1 antenna improves the efficiency as compared to other antennas. For use in many etching and deposition applications the uniformity of the plasma is important. The present invention uses a magnetic bucket in conjunction with the plasma generator to provide a uniform plasma density over large circular area. The invention uses one or multiple plasma generators in conjunction with a rectangular magnetic bucket to provide a uniform density over large rectangular area for the coating or etching of rectangular substrates. The invention uses expansion of the magnetic field to allow deposition or etching over a large area. The present invention uses a linear configuration to coat or etch large substrates. The invention uses the plasma generator in conjunction with electrostatic grids as a high efficiency, high ion current ion source. The invention uses the plasma generator in conjunction with a sputter target for the sputter deposition of materials onto substrates.

DESCRIPTION OF THE PREFERRED EMBODIMENTS

Figure 1:
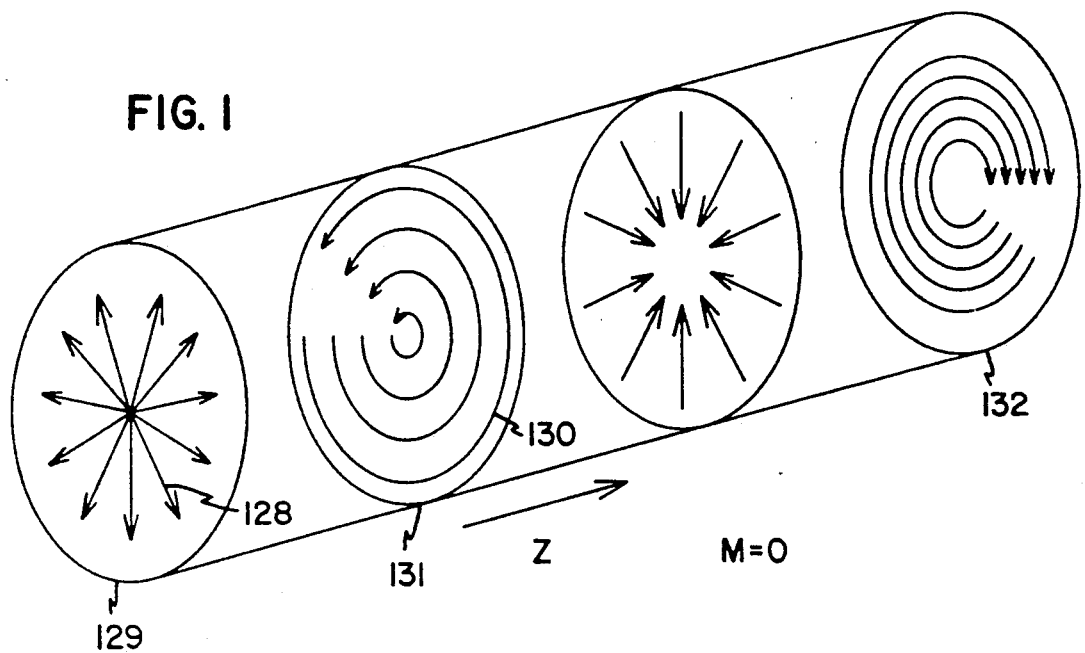
FIG. 1 is a perspective view of electromagnetic wave electric field vectors for the m=0 mode.
Figure 2:
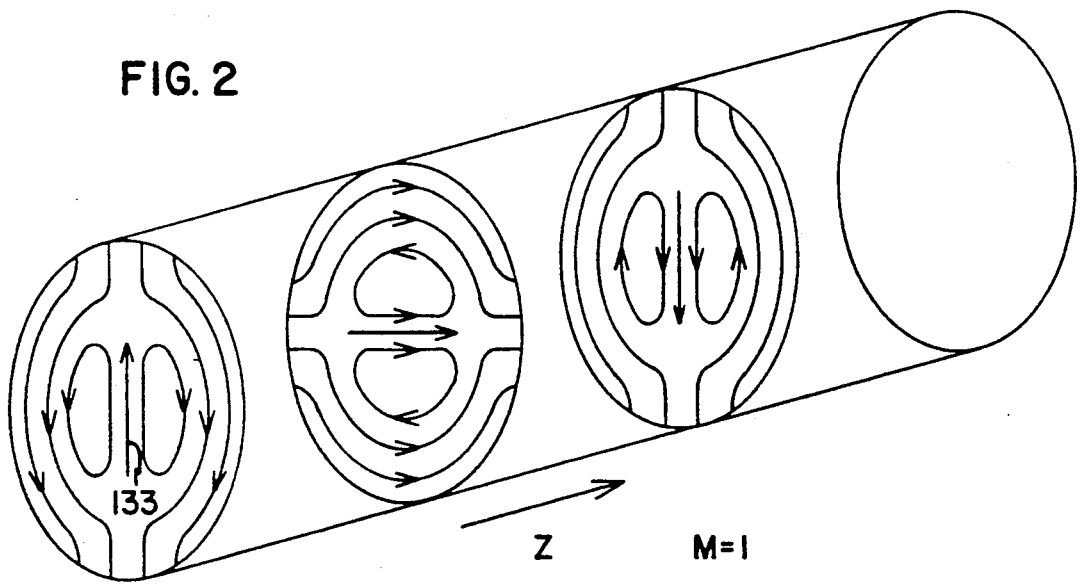
FIG. 2 is a perspective view of electromagnetic wave electric field vectors for the m=1 mode.
Figure 3A:
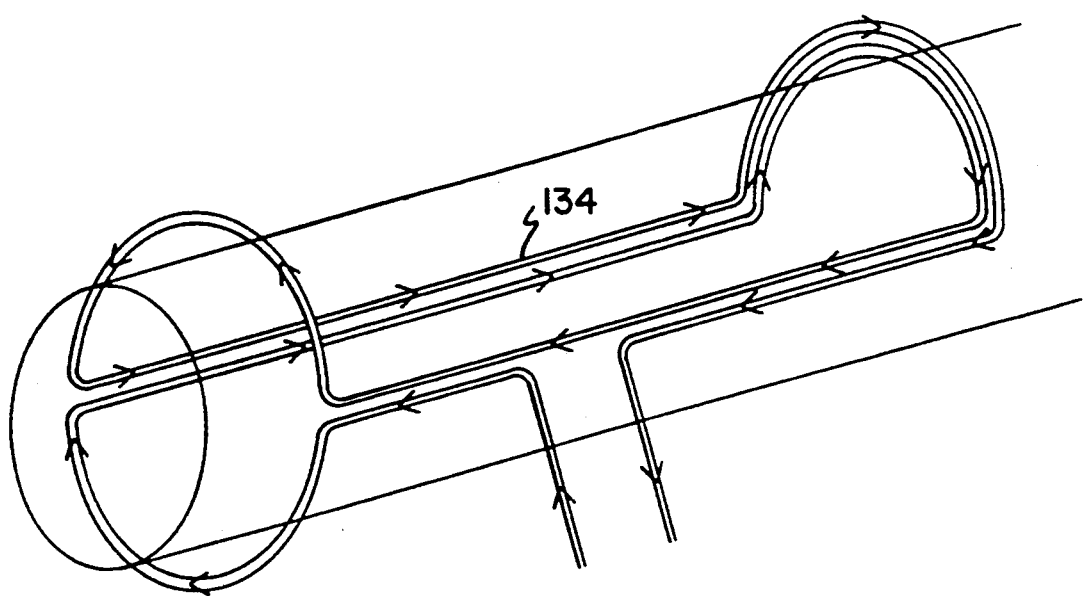
FIG. 3a is a perspective view of an antenna arrangement.
Figure 3B:
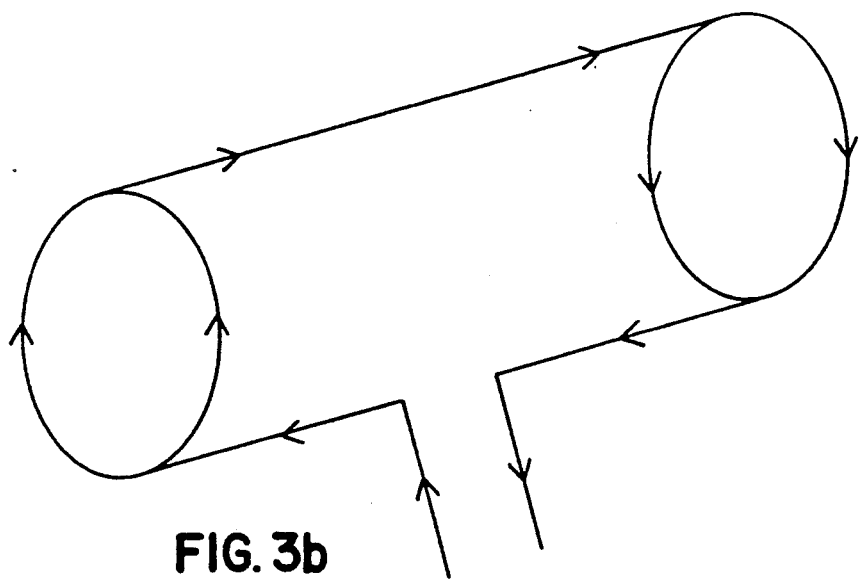
FIG. 3b is a schematic diagram depicting RF current flow in an antenna arrangement.
Figure 4:
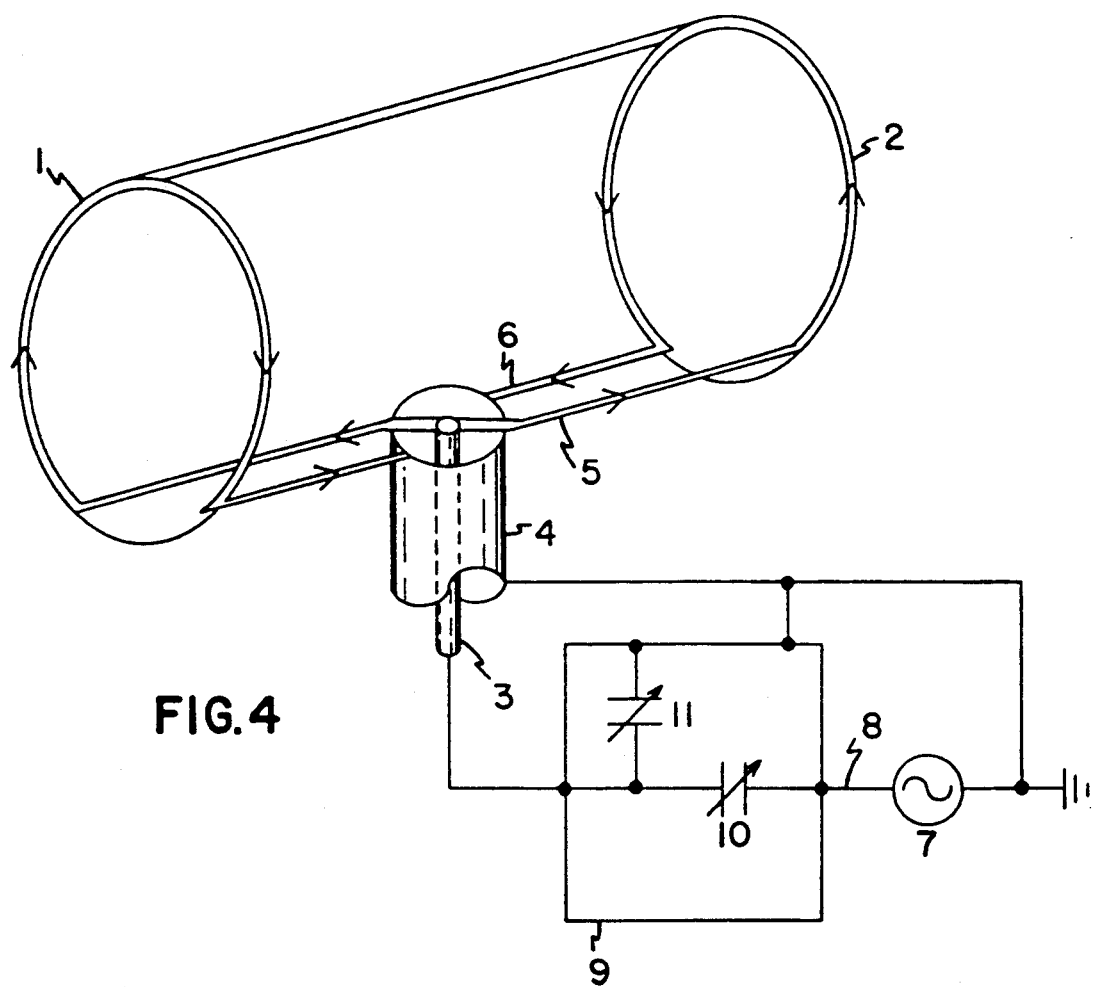
FIG. 4 is a schematic diagram depicting the principle of operation and RF current flow in an antenna constructed according to the principles of the present invention for the m=0 mode.

The first principle structure of the present invention is the antenna configuration as shown in FIG. 4. RF current is made to flow through two circular loops 1 and 2 in such a way that the current in one loop is passing in a clockwise manner while the current in the other loop is passing in an anti-clockwise manner. This is achieved by applying an RF voltage between an inner electrode 3 and an outer electrode 4 which is grounded and by using the conductors 5 and 6 to connect the two loops. The distance L between the loops is adjusted to match the conditions in the plasma as dictated by the dispersion relation, $[w/w_c \cdot w_p^2/C^2 k_z^2]^2 = 1 + (3.83/k_z a)^2$.

The RF voltage is applied from an RF power supply 7 through a 50 ohm cable 8 to a matching box 9 which consists of two variable vacuum capacitors 10 and 11 which are tuned so that the loading of the antenna is close to 50 ohms in order to minimize the reflected power.

Figure 5:
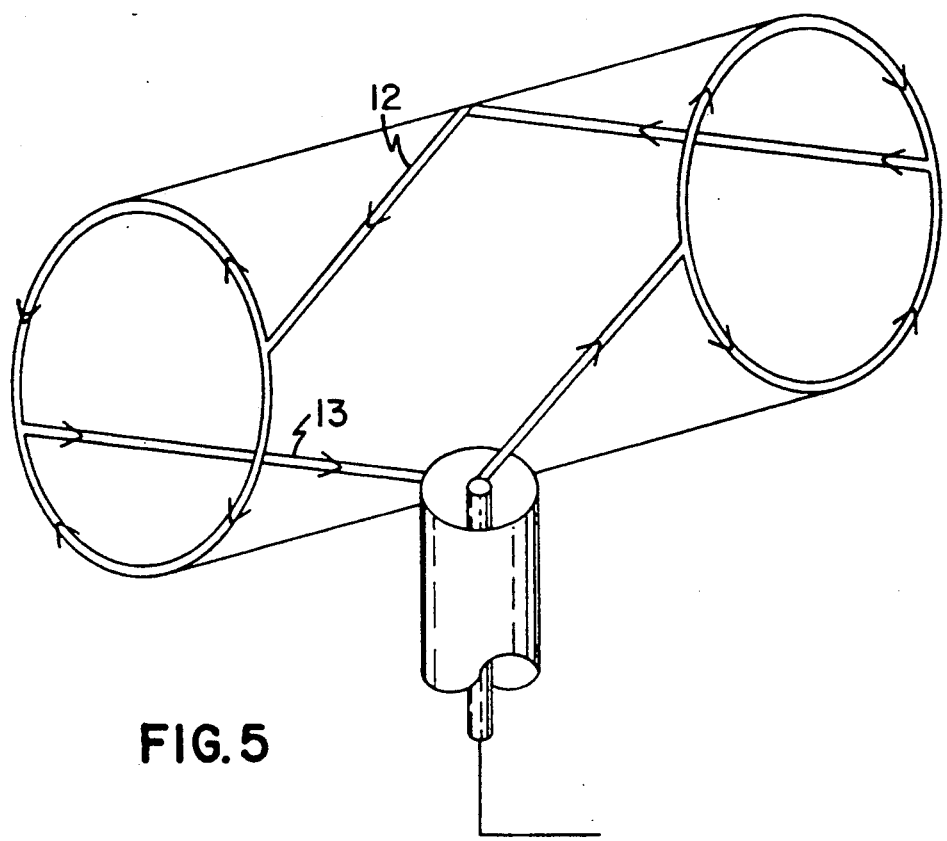
FIG. 5 is a perspective view of an antenna constructed according to the principles of the present invention depicting the principle of operation and RF current flow in a second configuration used to excite the m=1 mode.

In FIG. 5 a second arrangement of an antenna is shown. In this arrangement the RF current path is modified so that the current is made to flow in two helical shaped paths 12 and 13.

Figure 6:
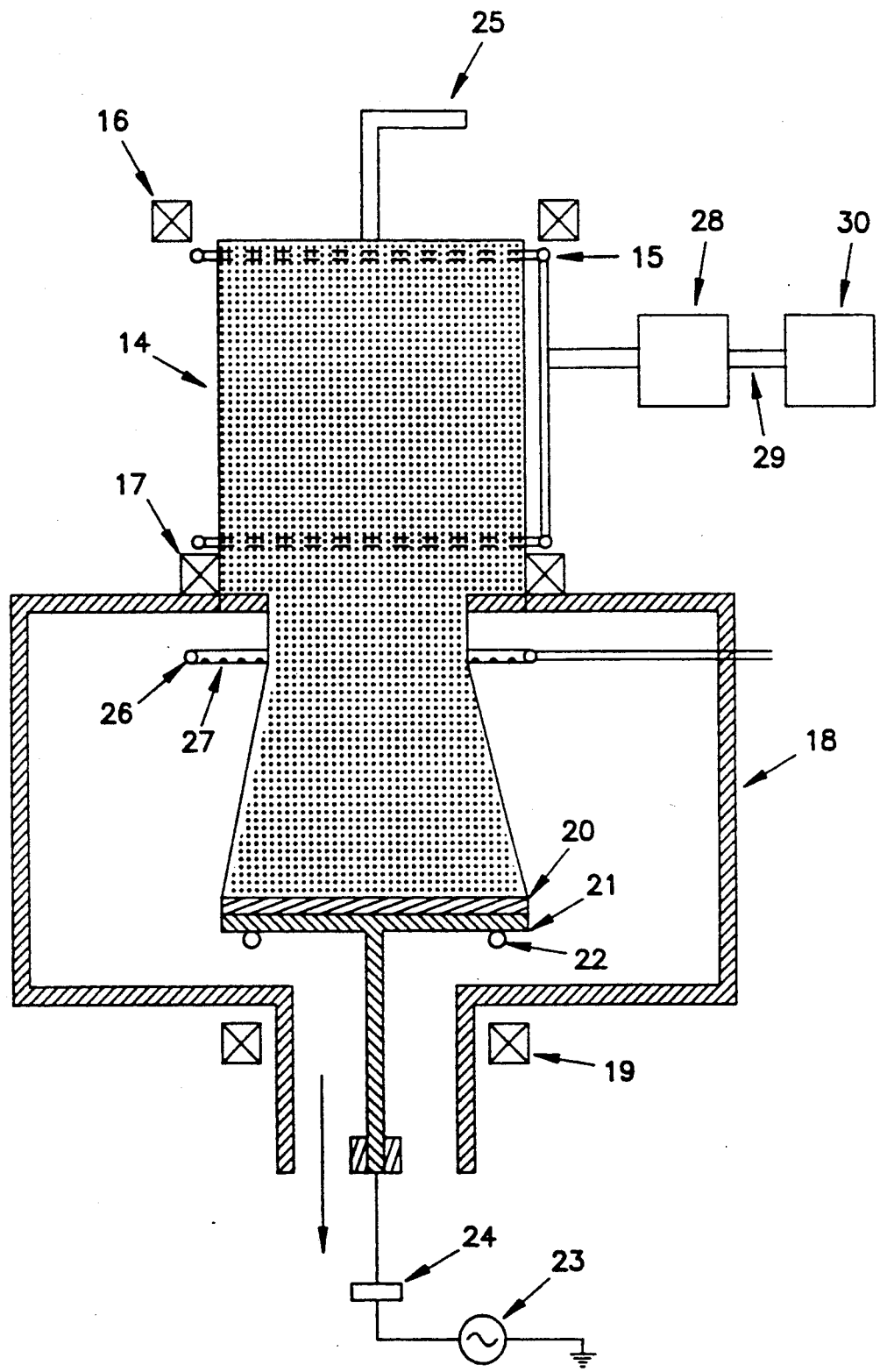
FIG. 6 is a schematic diagram of the basic configuration of a plasma deposition or etching device constructed in accordance with the principles of the present invention.

The basic configuration of a plasma deposition or etching apparatus according to the present invention is shown in FIG. 6. The plasma generation chamber 14 is cylindrical in shape and is made of a non-conducting material such as quartz or pyrex. The antenna 15 is mounted as shown and can be of the type described in FIG. 4 or FIG. 5. An axial magnetic field is provided by the magnetic field coils 16 and 17. The plasma is transported by the magnetic field to a separate process chamber 18 and the shape of the plasma can be controlled by varying the current in the magnetic field coil 19. The substrate 20 to be coated or etched is mounted on a substrate holder 21 which is electrically isolated. Plasma that bombards the substrate 20 causes the substrate 20 to reach a negative self bias of between 10 and 30 V. For some films to be formed it is advantageous for the film to be bombarded by ions with greater energy than they would obtain due to the self-bias. In this case it is necessary to apply RF power from a second RF source 23 through a second matching circuit 24. The substrate holder 21 is a copper block that is cooled or heated by a heating/cooling circuit 22. Gas is injected in two places 25 and 26. 25 is a stainless steel tube connected to the plasma generation chamber 14. 26 is a stainless steel ring with a diameter that is large compared to the size of the holes 27 that are distributed equally around the ring. This arrangement is such that a uniform flow of gas is directed towards the substrate 20. The RF voltage is applied to the antenna 15 by means of a matching circuit 28 which consists of two vacuum capacitors 10,11 described in FIG. 4. This matching circuit is necessary to maximize the power that is coupled into the plasma and minimize the power that is reflected back along the 50 ohm cable 29 to the RF power supply 30.

Figure 7:
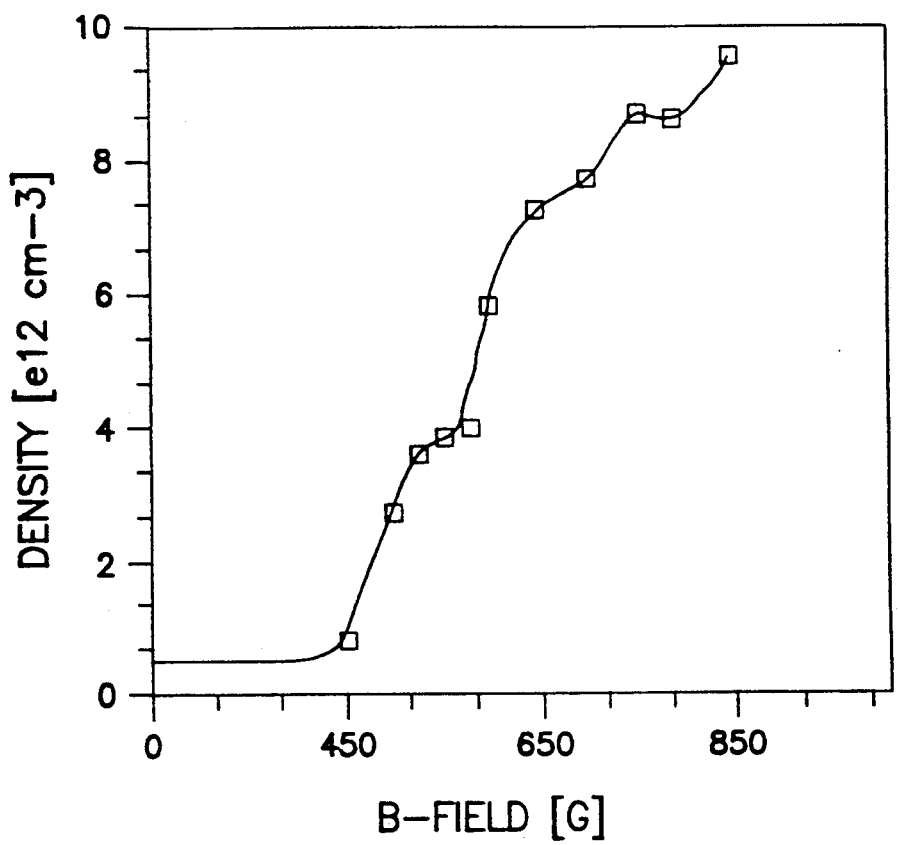
FIG. 7 is a graph depicting the relationship of plasma density to magnetic field strength according to the invention as depicted in FIG. 6 using the antenna described in FIG. 4.

Using this basic configuration, plasmas of density up to $1 \times 10^{13}/cm^3$ have been produced. In FIG. 7 the plasma density is shown as a function of magnetic field. In this experiment the antenna as described in FIG. 4 was used. The mode excited in this case is the m=0 mode. The diameter of the plasma generator was 10 cm and the coil spacing was 15 cm. The RF was at a frequency of 13.56 MHz and was supplied using a commercial RF power supply through a matching box as shown in FIG. 4. The gas used in this experiment was argon and the pressure was 1.5 mtorr. Reflected power was tuned to be less than 1% of the applied power of 2.40 kW.

Figure 8:
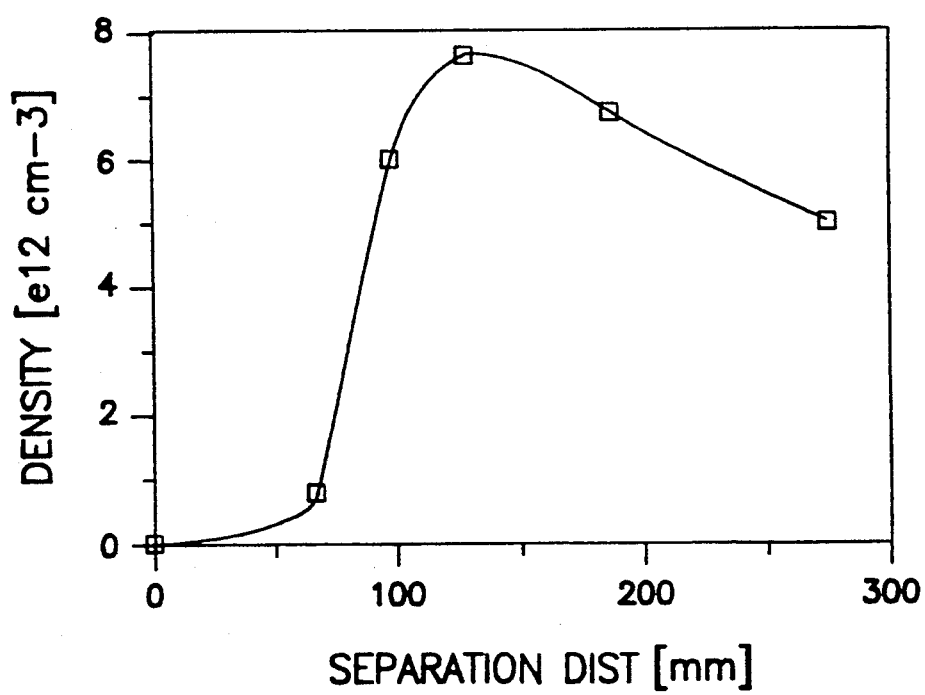
FIG. 8 is a graph depicting the relationship of plasma density to the separation of the loops of the antenna described in FIG. 4.

The importance of the spacing between the loops in order to control the wave number k has been demonstrated. FIG. 8 depicts the dependence of the plasma density on the spacing between the loops for a fixed RF power, magnetic field and pressure. The pressure was 2 mtorr, the magnetic field was 650 Gauss and the RF power was 2.75 kW. In this example there is an optimum spacing of the loops at approximately 125 MM.

Figure 9:
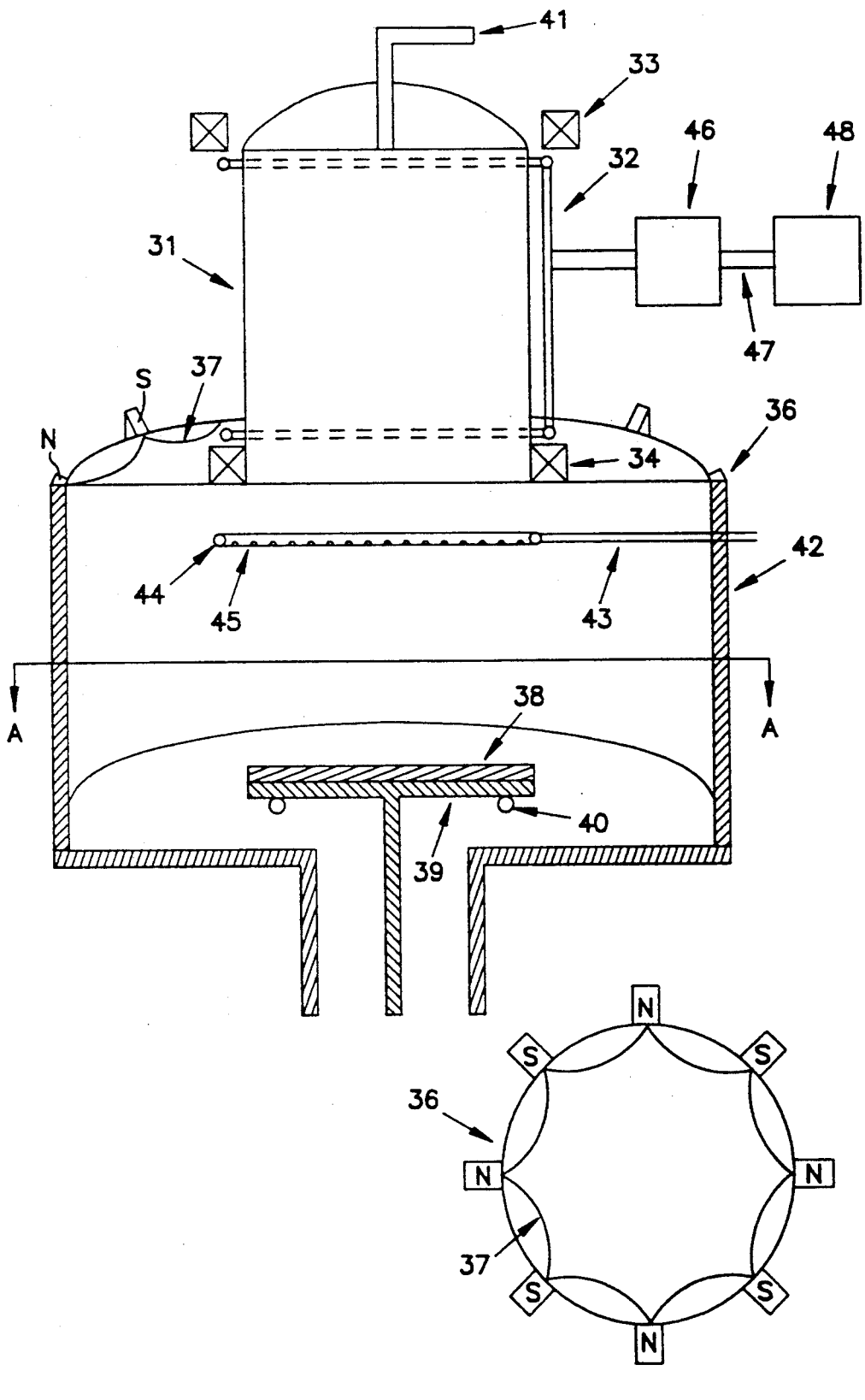
FIG. 9 is a schematic diagram of a second embodiment of the present invention used for plasma deposition or etching over large circular areas where uniformity requirements are important.

FIG. 9 shows an arrangement where high uniformity over a large area is required. The plasma generation chamber 31 is cylindrical in shape and is made of a non-conducting material such as quartz or pyrex. The antenna 32 is mounted as shown and can be of the type described in FIG. 4 or FIG. 5. An axial magnetic field is provided by the magnetic field coils 33 and 34. The plasma is transported by the magnetic field to the magnetic bucket chamber 35.

In a paper by Limpaecher and Mackenzie (R. Limpaecher and K.R. Mackenzie, Rev. Sci. Instrum. 44,726 (1973) is the disclosure that using magnets in a multicusp arrangement can provide very uniform plasma parameters in a central zone of the volume enclosed by the magnets. The arrangement of the magnets around the circumference of a cylinder is a common arrangement used for ion sources and is referred to as a magnetic bucket. It is important to design the magnetic field in such a way that there is a good match between the axial field provided by the coil 34 and the field in the bucket. The plasma from the generator diffuses along the magnetic field lines and expands to fill the bucket. The magnetic bucket chamber 35 is made of stainless steel and can be of, for example, circular or rectangular cross-section. In either case the dimensions of the bucket are such that it is larger than the diameter of the plasma generator. The magnetic field within the bucket is provided by permanent magnets 36 arranged with their poles perpendicular to the surface of the bucket chamber and with alternating north N and south S poles. With this arrangement, the magnetic field lines 37 follow a multicusp pattern and the field in the central zone is very low. The magnetic field pattern provided by the magnets is shown in view A—A. The substrate 38 to be coated or etched is mounted on a substrate holder 39. The substrate holder is a copper block that is cooled or heated by a heating/cooling circuit 40. Gas is injected in two places 41 and 42. 43 is a stainless steel tube connected to the plasma generation chamber 31. A stainless steel ring 44 has a diameter that is large compared to the size of the holes 45 that are distributed equally around the ring 44. This arrangement is such that a uniform flow of gas is directed towards the substrate 38. The RF voltage is applied to the antenna 32 means of a matching circuit 46 which consists of two vacuum capacitors 10,11 as described in FIG. 4. This matching circuit is necessary to maximize the power that is coupled into the plasma and to minimize the power that is reflected back along the 50 ohm cable 47 to the RF power supply 48.

Figure 10:
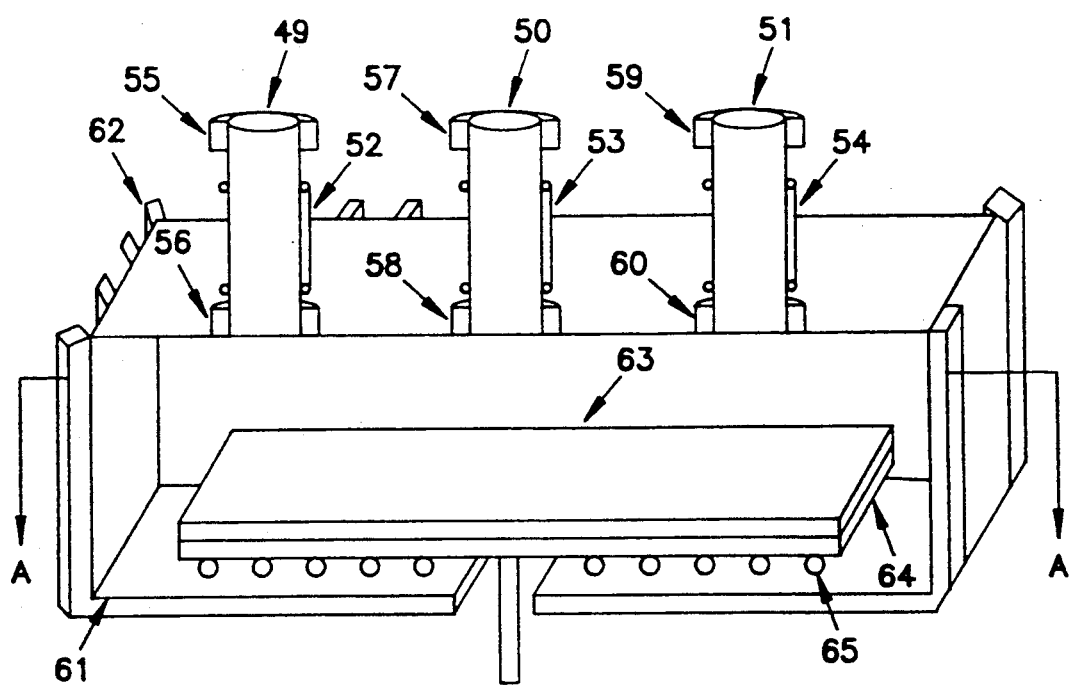
FIG. 10 is a perspective view of a third embodiment of the present invention for the deposition or etching over a large rectangular area where uniformity is important.
Figure 10:
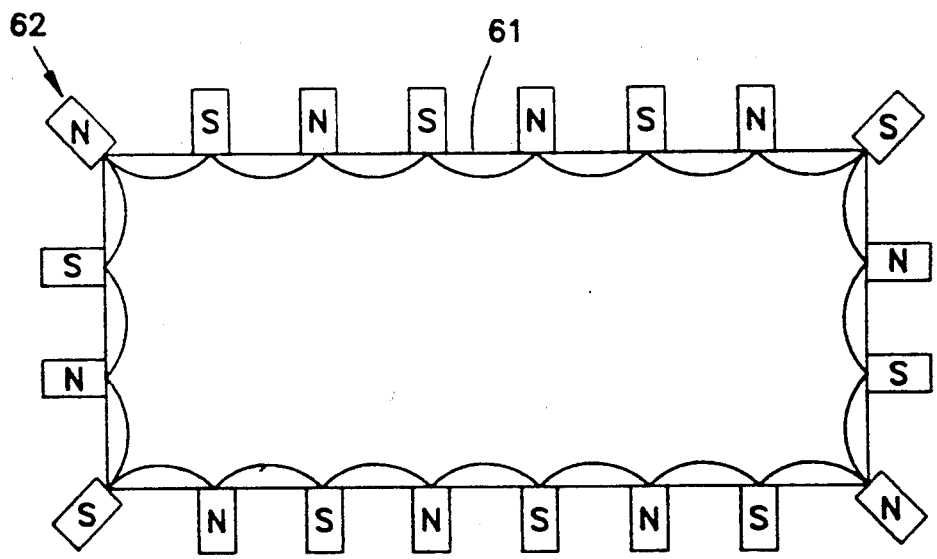

FIG. 10 shows an arrangement where high uniformity over large rectangular shaped areas is required such as needed in the coating of displays. The plasma generator is of the type described above and in this arrangement multiple generators may be used depending on the size of plasma needed. In FIG. 10 three plasma generators 49, 50 and 51 are shown. Each plasma generation chamber is cylindrical in shape and made of non-conducting material such as quartz or pyrex. The antennae 52,53 and 54 used on each generator is of the type described in FIG. 4 or FIG. 5. An axial magnetic field is provided by the magnetic field coils 55,56, 57, 58, 59, and 60. The plasma is transported by the magnetic field to the rectangular magnetic bucket chamber 61. The plasma diffuses along the field lines and expands to fill the bucket. The magnetic field within the bucket chamber 61 is provided by permanent magnets 62 arranged with their poles perpendicular to the surface of the bucket chamber and with alternating N and S poles. The magnetic field pattern provided by the magnets is shown in view A—A. The substrate 63 to be coated or etched is mounted on a substrate holder 64 which is electrically isolated. Plasma that bombards the substrate causes the substrate to reach a negative self bias of between 10 and 30 V. For some films to be formed or in some etching applications it is advantageous for the substrate 63 to be bombarded with energetic ions. In this case it is necessary to apply RF power from a second RF power supply through a second matching circuit to the substrate holder 64. The substrate holder 64 is a copper block that is cooled or heated by a heating/cooling circuit 65.

Figure 11:
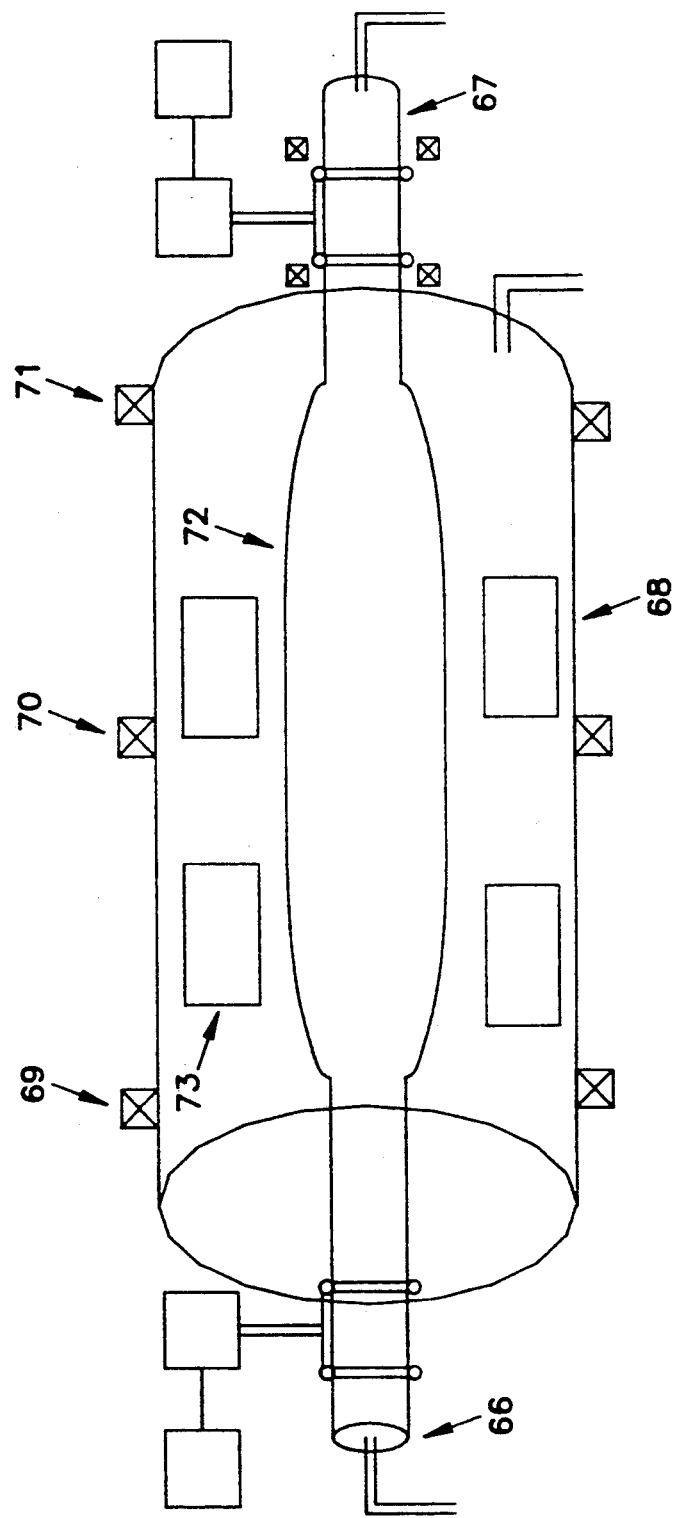
FIG. 11 is a schematic diagram of a fourth embodiment of the present invention for deposition or etching of large area substrates.

FIG. 11 is another embodiment according to the present invention that is suitable for the etching or coating of large area substrates. Two plasma generators 66 and 67 are mounted on a common axis at each end of a cylindrical process chamber 68. Each plasma generator is as described above and may use an antenna as described in FIG. 4 or FIG. 5. Magnetic field coils 69, 70 and 71 provide a uniform axial magnetic field along the axis of the process chamber 68. Plasma produced in each generator will diffuse along the magnetic field lines and because of the high mobility of the plasma electrons the density along the length of the process chamber will be uniform. The size of the plasma in the process chamber can be controlled or varied by adjusting the magnetic field in the process chamber by varying the currents in the magnetic field coils 69, 70 and 71. If the magnetic field in the process chamber is weaker than in the generator then the plasma 72 will expand and be of larger diameter in the process chamber than in the generators. The substrates 73 are mounted on a substrate holder and are positioned around the circumference of the process chamber.

Figure 12:
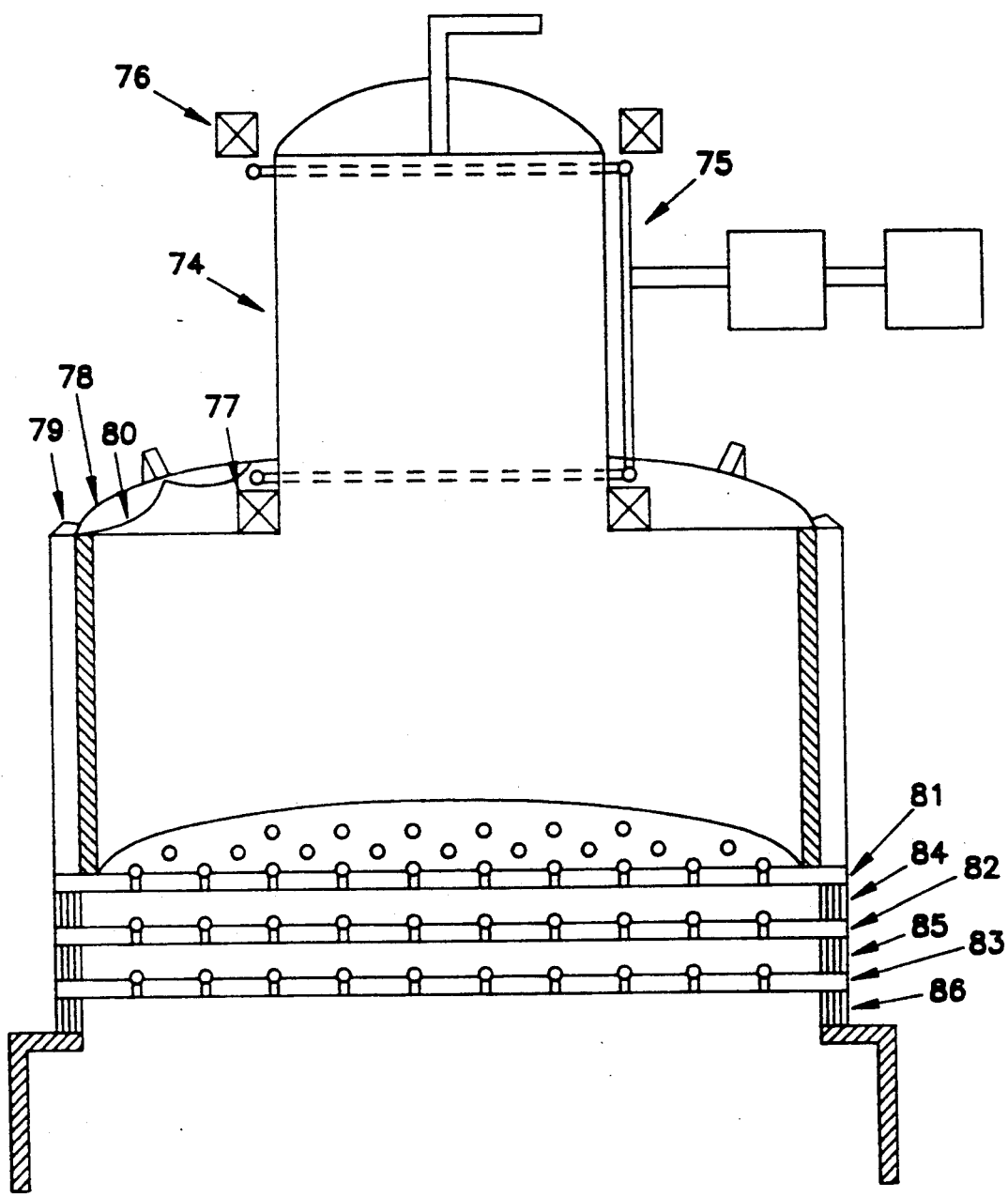
FIG. 12 is a side elevation of a fifth embodiment of the present invention for providing an ion beam.

FIG. 12 is another embodiment according to the present invention. The plasma generation chamber 74 is cylindrical in shape and is made of a non-conducting material such as quartz or pyrex. The antenna 75 is mounted as shown and can be of the type described in FIG. 4 or FIG. 5. An axial magnetic field is provided by the magnetic field coils 76 and 77. The plasma is transported by the magnetic field to the magnetic bucket chamber 78. It is important to design the magnetic field in such a way that there is a good match between the axial field provided by the coil 77 and the field in the bucket. The plasma from the generator diffuses along the magnetic field lines and expands to fill the bucket. The magnetic bucket chamber 78 is made of stainless steel and can be of circular or rectangular cross-section. In either case the dimensions of the bucket are such that it is larger than the diameter of the plasma generator. The magnetic field within the bucket is provided by permanent magnets 79 arranged with their poles perpendicular to the surface of the bucket chamber and with alternating north N and south S poles. With this arrangement the magnetic field lines 80 follow a multicusp pattern and the field strength in the central zone is very low. A series of electrodes 81, 82, and 83 are used for extraction of an ion beam from the plasma in the magnetic bucket. Each of the electrodes are electrically isolated by insulators 84, 85, and 86.

Figure 13:
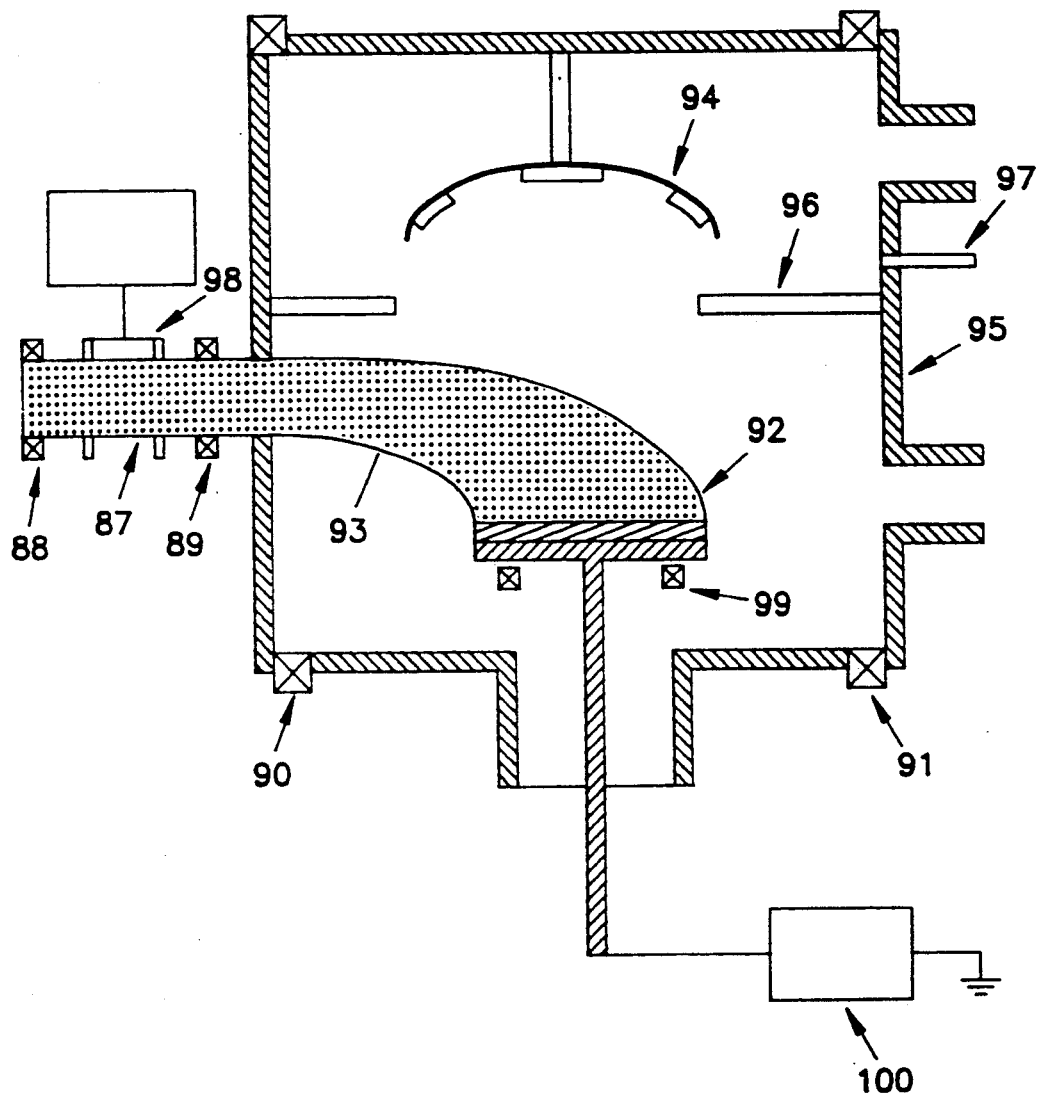
FIG. 13 is a schematic diagram of a sixth embodiment of the present invention for sputter deposition.

FIG. 13 is another embodiment according to the present invention which is suitable for sputter deposition on to substrates. A plasma generator 87 is mounted at the side of a process chamber 95. The plasma generator is described above and may use an antenna 98 as described in FIG. 4 or FIG. 5. Magnetic field coils 88 and 89 provide an axial magnetic field in the generator. Magnetic field coils 90 and 91 provide an axial magnetic field in the process chamber 95 that is matched to the coils 88 and 89. The plasma 93 follows the magnetic field lines from the plasma generator 87 to the sputter target 92 which may be biased to a negative voltage for sputtering. The plasma is made to conform to the target 92 by means of the magnetic field coil 99 which works together with the coils 90 and 91. Material is sputtered from the target 92 by applying a negative voltage from the power supply 100 to the target and is deposited on substrates 94. The power supply 100 can be DC for metallic targets or RF for dielectric targets. A baffle 96 may be introduced to control gas flow. In reactive deposition processes, a reactive gas may be introduced through a separate gas injection system through 97.

Figure 14:
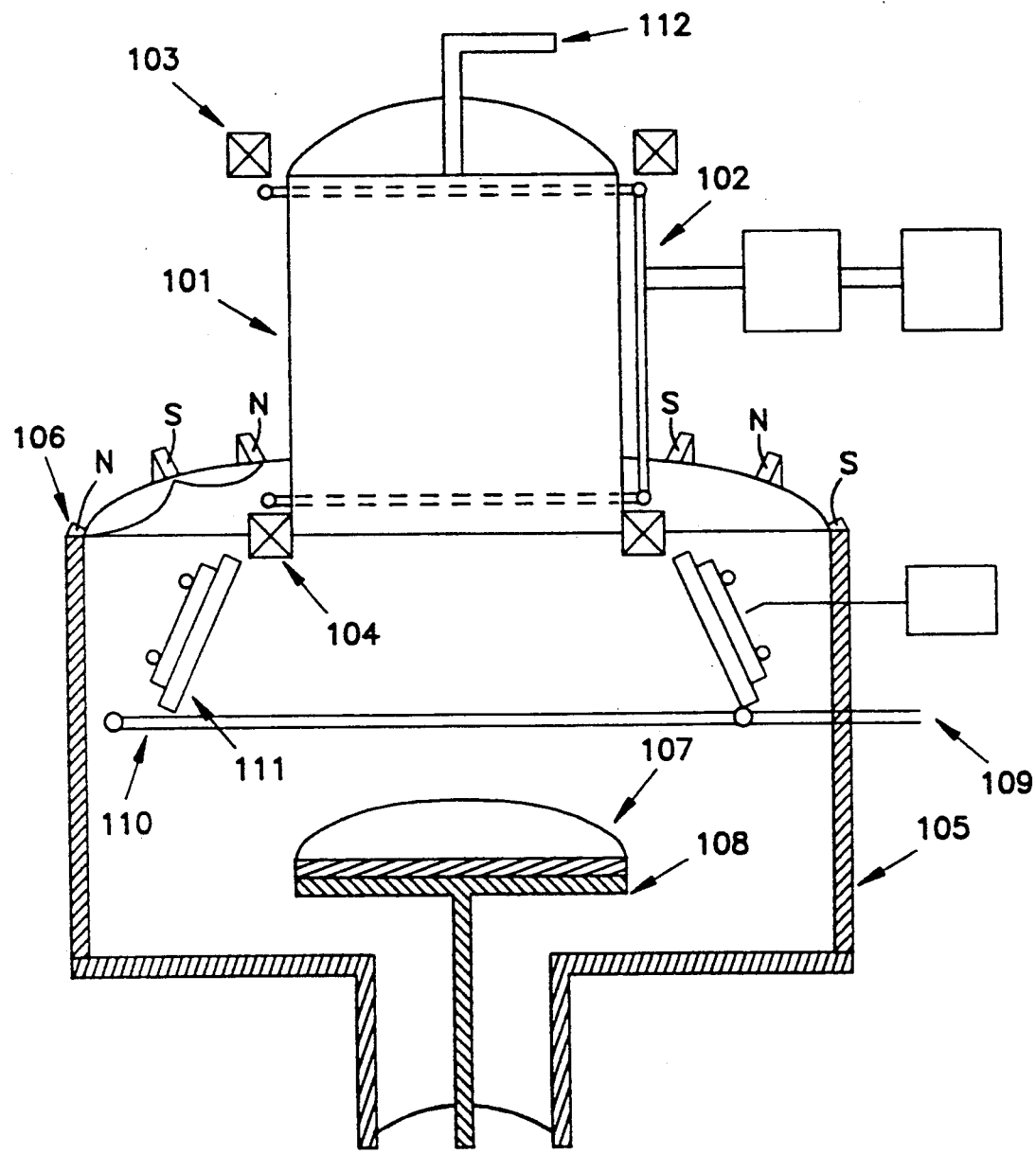
FIG. 14 is a side elevation of a seventh embodiment of the present invention for sputter deposition over substrates of large area where uniformity is important.

FIG. 14 is another embodiment according to the present invention that is suitable for using the RF plasma generator system of the present invention in conjunction with a sputter target. The plasma generator 101 and its antenna 102 and its magnetic field coils 105 and 106 are as described, and there may be more than one plasma generator system as described in FIG. 10. The plasma generation chamber is cylindrical in shape and is made of a non-conducting material such as quartz or pyrex. The antenna can be of the type described in FIG. 4 or FIG. 5. The plasma is transported along the magnetic field into the magnetic bucket process chamber 105 which is made of stainless steel and can be of circular or rectangular shape as described in FIG. 10. It is important to design the magnetic field in such a way that a good match between the axial field provided by coil 104 and the field in the bucket. In any case, the dimensions of the bucket are such that it is larger than the diameter of the plasma generator. The magnetic field inside the bucket is provided by permanent magnets 106 arranged with their poles perpendicular to the surface of the bucket chamber and with alternating north N and south S poles. Within the magnetic bucket process chamber is located a substrate 107 mounted on a substrate holder 108. Plasma fills the bucket essentially uniformly and other gases such as reactive gas may be introduced at 109 by means of a ring 110. Also within the bucket is located a circular or rectangular sputter target 111. When a biased voltage is applied to the target, ions from the plasma in the bucket bombard the target with an energy equal to the voltage applied to the target. Sputter material is deposited on the substrate 107 where it may react with gases introduced from 109 and/or from the plasma generator 112.

Figure 15:
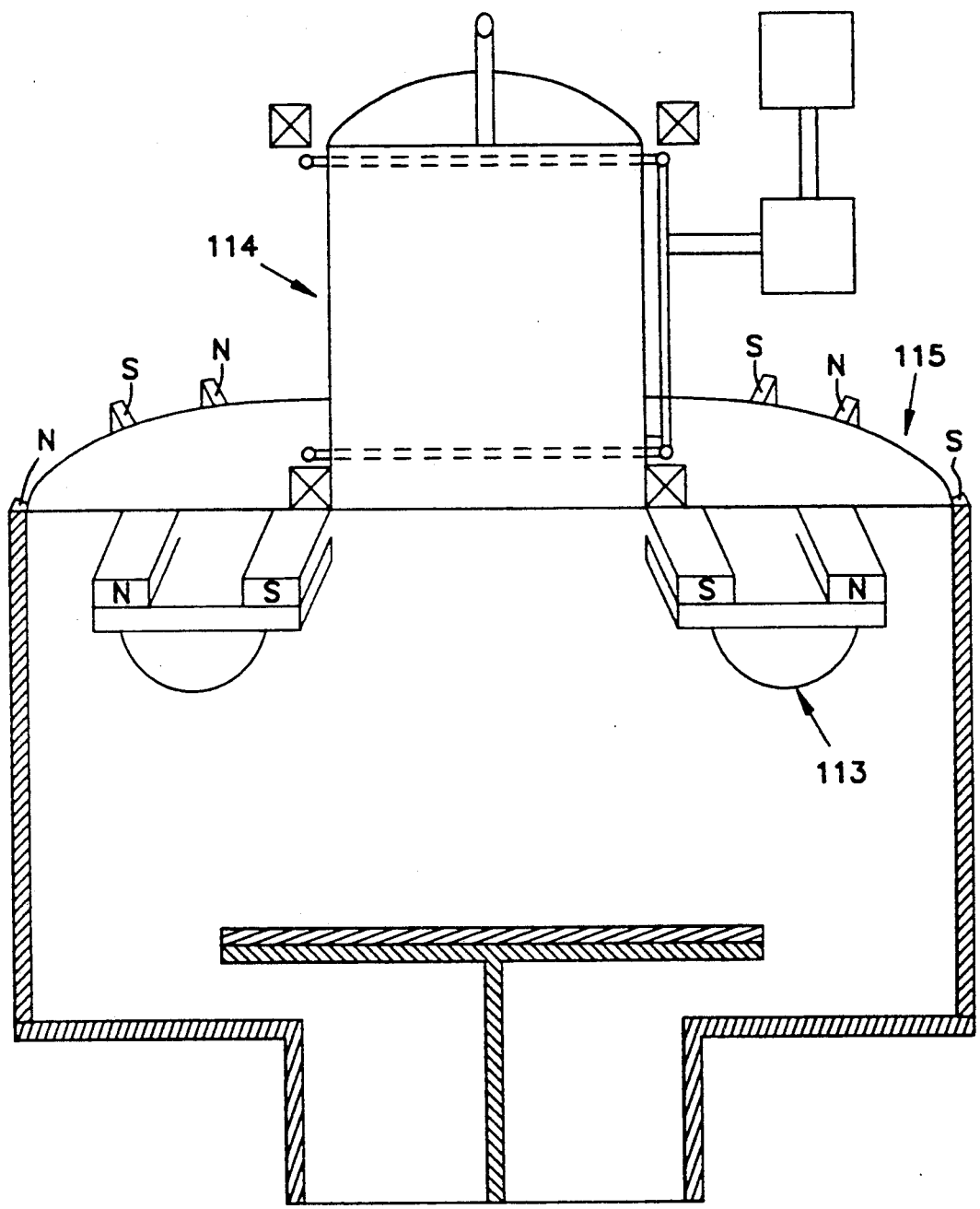
FIG. 15 is a side elevation of an eighth embodiment of the present invention for sputter deposition that uses the plasma generator in conjunction with a magnetron.

FIG. 15 is another embodiment according to the present invention essentially similar to the embodiment of FIG. 14 except that the sputter target 111 in FIG. 14 is replaced by a magnetron sputter target 113 in FIG. 15. Plasma leaving the plasma generator 114 enters the magnetic bucket process chamber 115 and fills the chamber. Sputter target 113 can be circular or rectangular and can be horizontal or at an angle. When a bias voltage is applied, sputtering increases at the target and the sputtered material is deposited on the substrate 115. All remaining systems in FIG. 15 are as labelled in FIG. 14.

Figure 16:
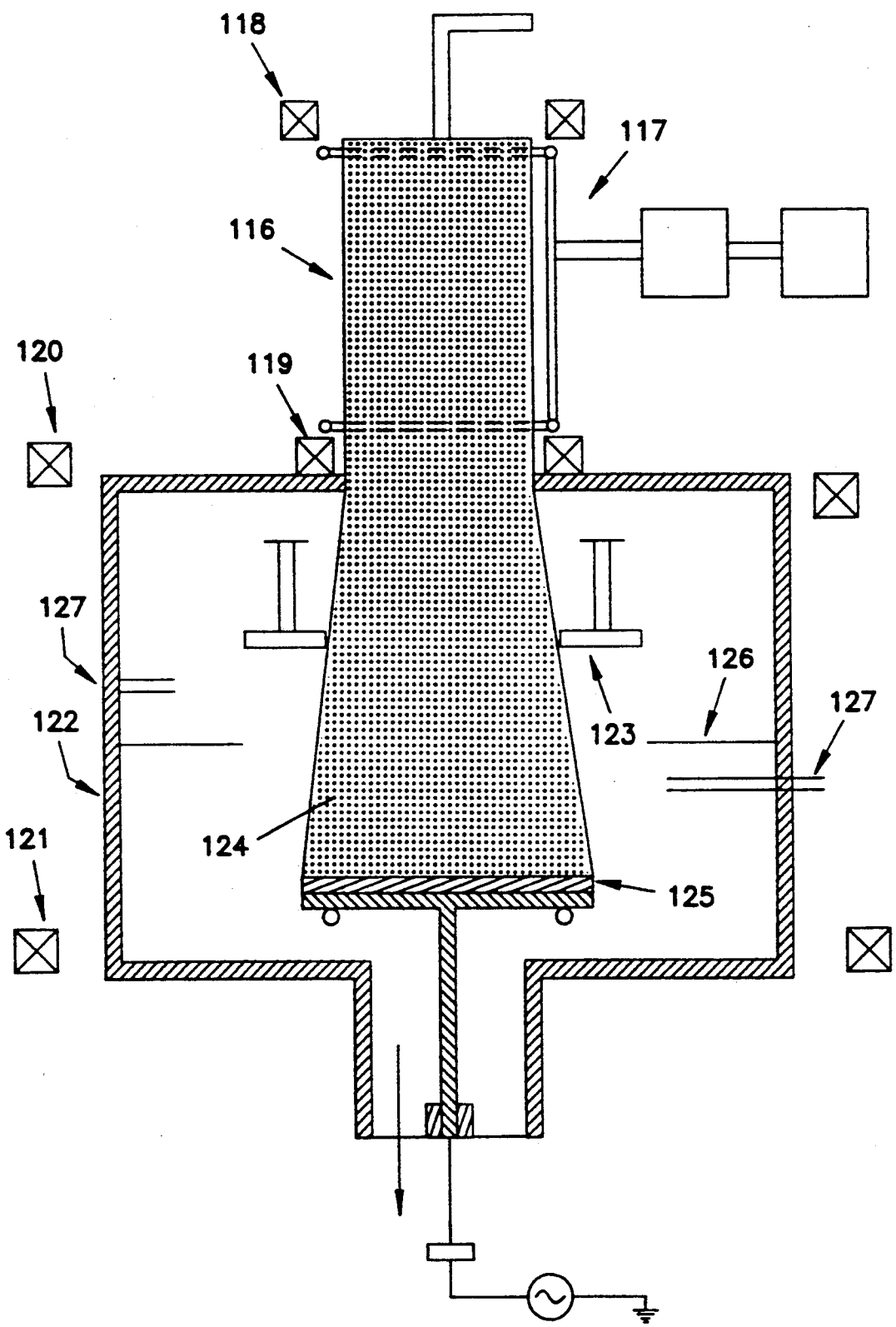
FIG. 16 is a schematic diagram depicting a ninth embodiment of the present invention for sputter deposition.

FIG. 16 is another embodiment according to the present invention. The plasma generator chamber 116 is cylindrical in shape and is made of a non-conducting material such as quartz or pyrex. The antenna 117 is mounted as shown and can be of the type described in FIG. 4 or FIG. 5. An axial magnetic field is provided by the magnetic field coils 118, 119, 120, and 121. The plasma 124 is transported from the plasma generator into the process chamber 122 and flows along the magnetic field to the sputter target 125 which is biased to a large negative voltage (about 700 V). The plasma diameter is made to conform to that of the target by controlling the magnetic field. The material sputtered from the target is deposited on the substrates 123. A baffle 126 may be used to control the gas pressure near the substrate and other gases may be introduced near the substrate through outlet 127. The substrates are mounted on a substrate holder and are positioned above the sputter target. The substrate holder has a hole to permit plasma to pass along the magnetic field from the plasma generator to the sputter target.

What is claimed is as follows:

1. An RF ion source comprising:
    (a) a plasma generation chamber, an antenna means to launch rf waves into said generation chamber which act in combination with an axial magnetic field to generate a dense plasma
    (b) a magnetic means for providing an axial magnetic field in the generator chamber
    (c) ion extraction electrodes adjacent to said plasma generator so as to extract ions from the plasma.

2. An antenna, comprising:
    (a) A first current loop, the first current loop having a current flow in a first direction; and
    (b) A second current loop, the second current having a current flow in a second direction.

3. The antenna of claim 2, wherein the first direction of current flow is opposite to the second direction of current flow.

4. The antenna of claim 3, wherein the first direction of current flow is clockwise, and the second direction of current flow is counter clockwise.

5. The antenna of claim 3, wherein the first current loop resides in a first plane and the second current loop resides in a second plane, the first and second planes being parallel.

6. The antenna of claim 5, wherein the first current loop and the second current loop are separated by a distance, the distance being selected so as to satisfy the equation:

$$[w/w_c \cdot w_p^2/c^2 k_z^2]^2 1 + (3.83/K_z a)^2.$$

7. The antenna of claim 6, wherein the antenna radiates radio frequency electromagnetic waves, the antenna receiving radio frequency current from a first conductor and a second conductor.

8. The antenna of claim 7, wherein the first current loop has a first terminal and a second terminal, and the second current loop has a first terminal and a second terminal, the first conductor being connected to the first terminal of the first current loop and to the second terminal of the second current loop, the second conductor being connected to the second terminal of the first current loop and to the first terminal of the second current loop.

9. The antenna of claim 8, wherein the first current loop has a longitudinal axis and the second current loop has a longitudinal axis, the first and second current loops being substantially coaxial.

10. The antenna of claim 9, wherein the first terminal of the first current loop is closer to the first terminal of the second current loop than to the second terminal of the second current loop.

11. The antenna of claim 7, wherein the first current loop has a first terminal and a second terminal, the first terminal being substantially diametrically opposite to the second terminal, the second current loop having a first terminal and a second terminal, the first terminal being substantially diametrically opposite to the second terminal.

12. The antenna of claim 11, wherein the first conductor is connected to the first terminal of the second current loop, the second terminal of the second current loop is connected to the second terminal of the first current loop, and the first terminal of the first current loop is connected to the second conductor.

13. The antenna of claim 12, wherein radio frequency current flows in a first and second helically shaped path.

14. A method of radiating electromagnetic waves, comprising the steps of:
    (a) causing electromagnetic energy to flow in a first angular direction within a first substantially planar circular loop;
    (b) causing the electromagnetic energy to flow in a second, opposite angular direction within a second substantially planar parallel circular loop separated by a distance from the first substantially planar circular loop so as to satisfy the equation:

$$[w/w_c \cdot w_p^2/C^2 k_z^2]^2 = 1 + (3.83/k_z^9)^2.$$

15. The method of radiating electromagnetic waves of claim 14, further comprising the step of causing the electromagnetic energy flowing between the first current loop and the second current loop to follow a helical path.

16. A method of plasma processing, comprising the steps of:
    (a) radiating electromagnetic energy into a plasma generation chamber;
    (b) injecting a first gas into the irradiated plasma generation chamber, thereby creating a plasma;
    (c) generating a variable magnetic field proximate the plasma generation chamber, the variable magnetic field permitting manipulation of the plasma;
    (d) transporting the plasma to an adjacent process chamber;
    (e) injecting a second gas into the process chamber; and
    (f) bombarding a substrate within the process chamber with the plasma, thereby permitting coating and etching of the substrate by the plasma.

* * * * *

UNITED STATES PATENT AND TRADEMARK OFFICE
CERTIFICATE OF CORRECTION

PATENT NO. : 5,091,049

DATED : February 25, 1992

INVENTOR(S) : Campbell et al.

It is certified that error appears in the above-identified patent and that said Letters Patent is hereby corrected as shown below:

Column 2, line 28, insert --,-- after the word "However".

Column 3, line 11, "$\mu_0 j,$" should read --$\mu_0 j,$--.

Column 3, line 15, "filed" should read --field--.

Column 3, line 24, "$(\mu\,en_.\,/B_.)$" should read --$(\mu_0 en_0/B_0)$--.

Column 3, line 25, "$a/\mu_.)$" should read --$(a/\mu_0)$--.

Column 3, line 31, "$J_m^1$" should read --$J_m'$--.

Column 3, line 33, "kind, $J_m$" should read --kind, $J_m'$--.

Column 3, line 50, "[w/" should read --[(w/--.

UNITED STATES PATENT AND TRADEMARK OFFICE
CERTIFICATE OF CORRECTION

PATENT NO. : 5,091,049
DATED : February 25, 1992
INVENTOR(S) : Campbell et al.

It is certified that error appears in the above-identified patent and that said Letters Patent is hereby corrected as shown below:

Column 6, line 7 & 10, insert --a-- after the word "over".

Column 8, line 68, insert --by-- after the numeral "32".

Column 10, line 21, "on to" should read --onto--.

Claim 2, column 11, line 51, insert --loop-- after "second current".

Claim 6, column 11, line 67, insert --=-- after the "$]^2$" and before 1.

Claim 14, column 12, line 46, "C" should read "c".

Signed and Sealed this

Thirty-first Day of August, 1993

Attest:

Attesting Officer

BRUCE LEHMAN

Commissioner of Patents and Trademarks